(12) United States Patent
Cheng et al.

(10) Patent No.: US 11,145,639 B2
(45) Date of Patent: Oct. 12, 2021

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Jung-Wei Cheng, Hsinchu (TW); Chien-Hsun Lee, Hsin-chu County (TW); Chi-Yang Yu, Taoyuan (TW); Hao-Cheng Hou, Hsinchu (TW); Hsin-Yu Pan, Taipei (TW); Tsung-Ding Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/718,034

(22) Filed: Dec. 17, 2019

(65) Prior Publication Data
US 2021/0183844 A1    Jun. 17, 2021

(51) Int. Cl.
*H01L 25/18* (2006.01)
*H01L 23/31* (2006.01)
*H01L 23/538* (2006.01)
*H01L 23/367* (2006.01)
*H01L 21/56* (2006.01)
(Continued)

(52) U.S. Cl.
CPC .......... *H01L 25/18* (2013.01); *H01L 21/4853* (2013.01); *H01L 21/4857* (2013.01); *H01L 21/561* (2013.01); *H01L 21/565* (2013.01); *H01L 21/568* (2013.01); *H01L 21/6835* (2013.01); *H01L 23/3128* (2013.01); *H01L 23/3675* (2013.01); *H01L 23/49816* (2013.01); *H01L 23/5385* (2013.01); *H01L 23/5386* (2013.01); *H01L 25/50* (2013.01); *H01L 2221/68359* (2013.01)

(58) Field of Classification Search
CPC ... H01L 25/18; H01L 21/565; H01L 21/4853; H01L 21/6835; H01L 21/561; H01L 25/50; H01L 23/3128; H01L 23/3675; H01L 21/568; H01L 23/5386; H01L 23/5385; H01L 21/4857; H01L 23/49816; H01L 2221/68359
USPC ....................................................... 257/668
See application file for complete search history.

(56) References Cited

U.S. PATENT DOCUMENTS 9,000,584 B2    4/2015   Lin et al.
9,048,222 B2    6/2015   Hung et al.
(Continued)

*Primary Examiner* — Vu A Vu
(74) *Attorney, Agent, or Firm* — JCIPRNET

(57) ABSTRACT

A semiconductor package and a manufacturing method thereof are provided. The semiconductor package includes a first semiconductor device, at least one second semiconductor device, at least one dummy die, an encapsulant and a redistribution structure. The first semiconductor device, the at least one second semiconductor device and at least one dummy die are laterally separated from one another, and laterally encapsulated by the encapsulant. A Young's modulus of the at least one dummy die is greater than a Young's modulus of the encapsulant. A sidewall of the at least one dummy die is substantially coplanar with a sidewall of the encapsulant. The redistribution structure is disposed over the encapsulant, and electrically connected to the first semiconductor device and the at least one second semiconductor device.

20 Claims, 19 Drawing Sheets

(51) Int. Cl.
    *H01L 21/48*         (2006.01)
    *H01L 21/683*       (2006.01)
    *H01L 23/498*       (2006.01)
    *H01L 25/00*         (2006.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,355,997 B2 * | 5/2016 | Katkar | H01L 23/147 |
| 9,368,460 B2 | 6/2016 | Yu et al. | |
| 9,372,206 B2 | 6/2016 | Wu et al. | |
| 9,496,189 B2 | 11/2016 | Yu et al. | |
| 2018/0269188 A1* | 9/2018 | Yu | H01L 23/5384 |
| 2019/0189599 A1* | 6/2019 | Baloglu | H01L 23/3675 |

* cited by examiner

SEMICONDUCTOR PACKAGE AND MANUFACTURING METHOD THEREOF

BACKGROUND

In recent years, the semiconductor industry has experienced rapid growth due to continuous improvement in integration density of various electronic components. For the most part, this improvement in integration density has come from continuously reductions in minimum feature size, which allows more of the smaller components to be integrated into a given area. These continuously scaled electronic components require smaller packages that occupy less area than previous packages.

Currently, integrated fan-out packages are becoming increasingly popular for their compactness to deliver merits including low power consumption, high performance, small package footprint, and competitive cost. However, stress is often induced in the integrated fan-out packages at least partly because of coefficient of thermal expansion (CTE) mismatch between an encapsulant and a redistribution structure formed thereon, and would result in problems such as cracks and delamination in the package structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
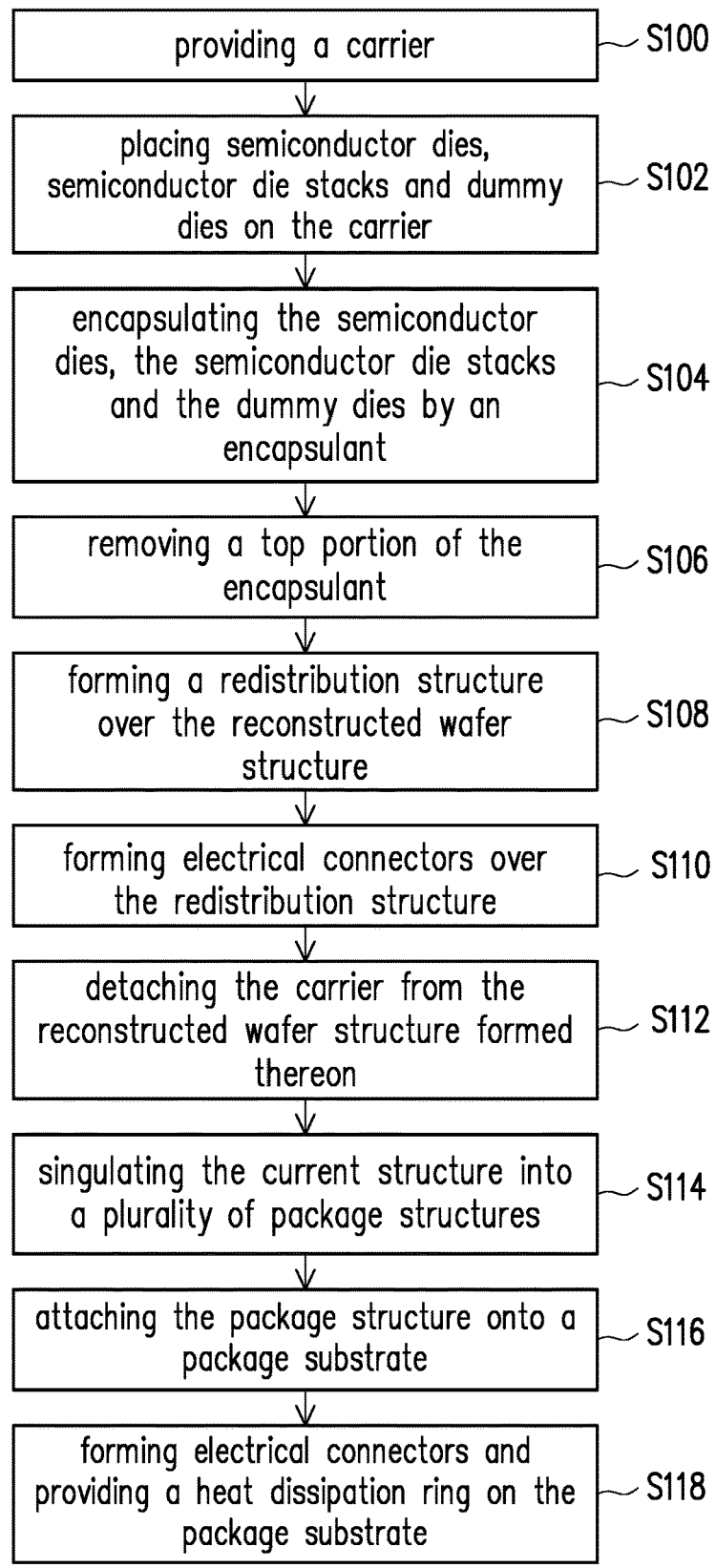
FIG. 1 is a flow diagram illustrating a manufacturing method of a semiconductor package according to some embodiments in the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1 is a flow diagram illustrating a manufacturing method of a semiconductor package according to some embodiments in the present disclosure. FIG. 2A through FIG. 2J are cross-sectional views of structures at various stages during the manufacturing method of the semiconductor package shown in FIG. 1. FIG. 3A through FIG. 3D are exemplary top views of FIG. 2B, FIG. 2D, FIG. 2H and FIG. 2J, respectively.

Figure 2A:
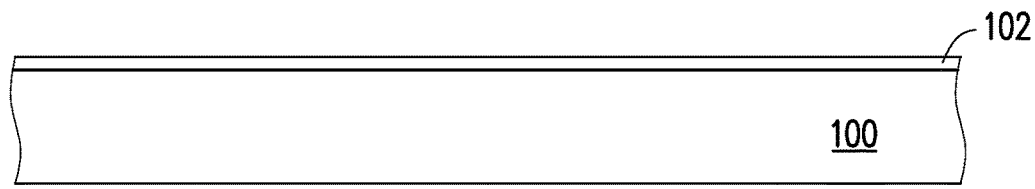
FIG. 2A through FIG. 2J are cross-sectional views of structures at various stages during the manufacturing method of the semiconductor package shown in FIG. 1.
Figure 2B:
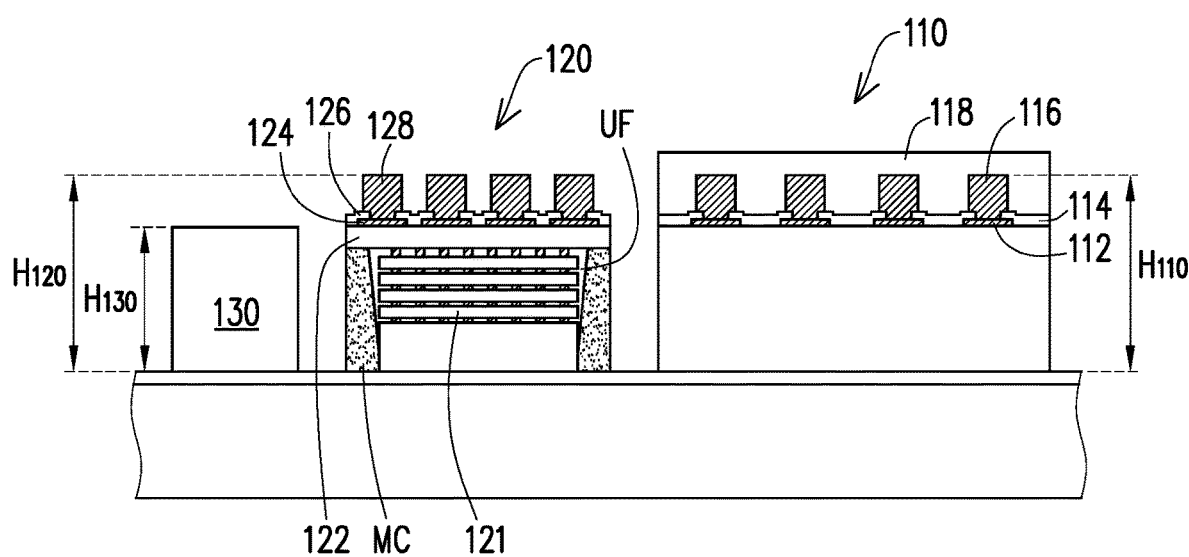

Referring to FIG. 1 and FIG. 2A, step S100 is performed, and a carrier 100 is provided. In some embodiments, the carrier 100 is a glass substrate. An adhesive layer 102 may be formed on a surface of the carrier 100 on which electronic components to be placed in the following step (as shown in FIG. 2B). In some embodiments, the adhesive layer 102 is a light-to-heat conversion (LTHC) release layer or a thermal release layer.

Figure 2C:
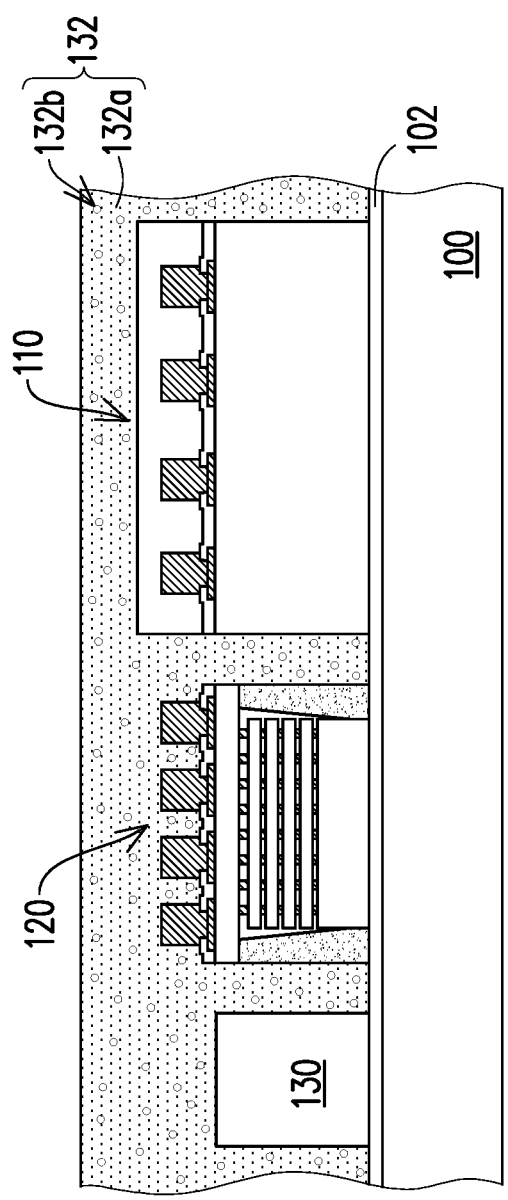
Figure 2E:
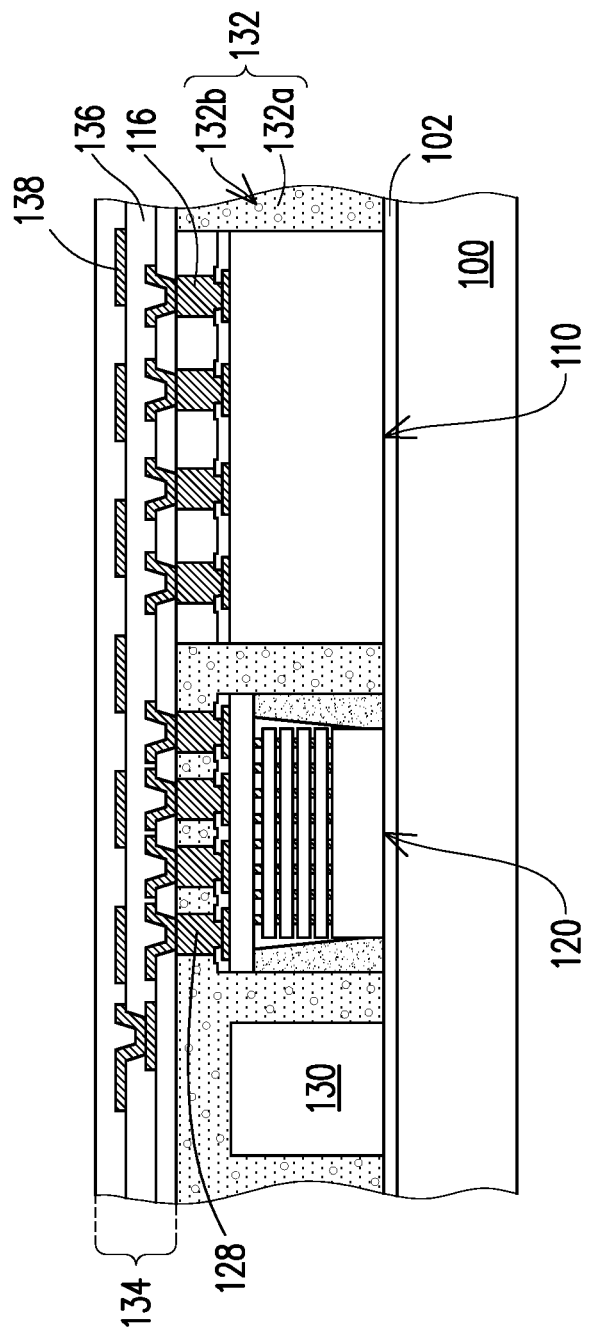
Figure 2J:
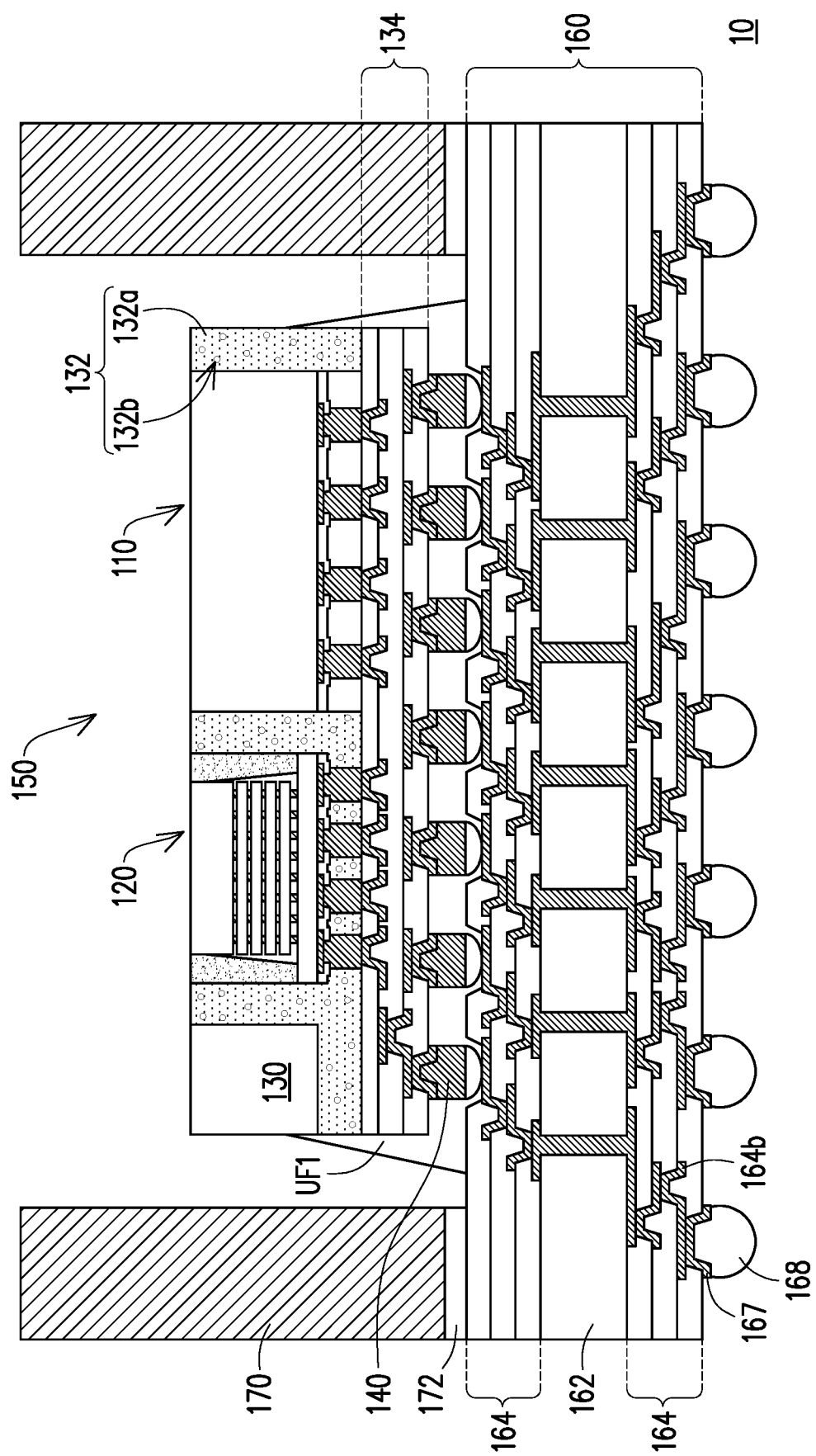
Figure 3A:
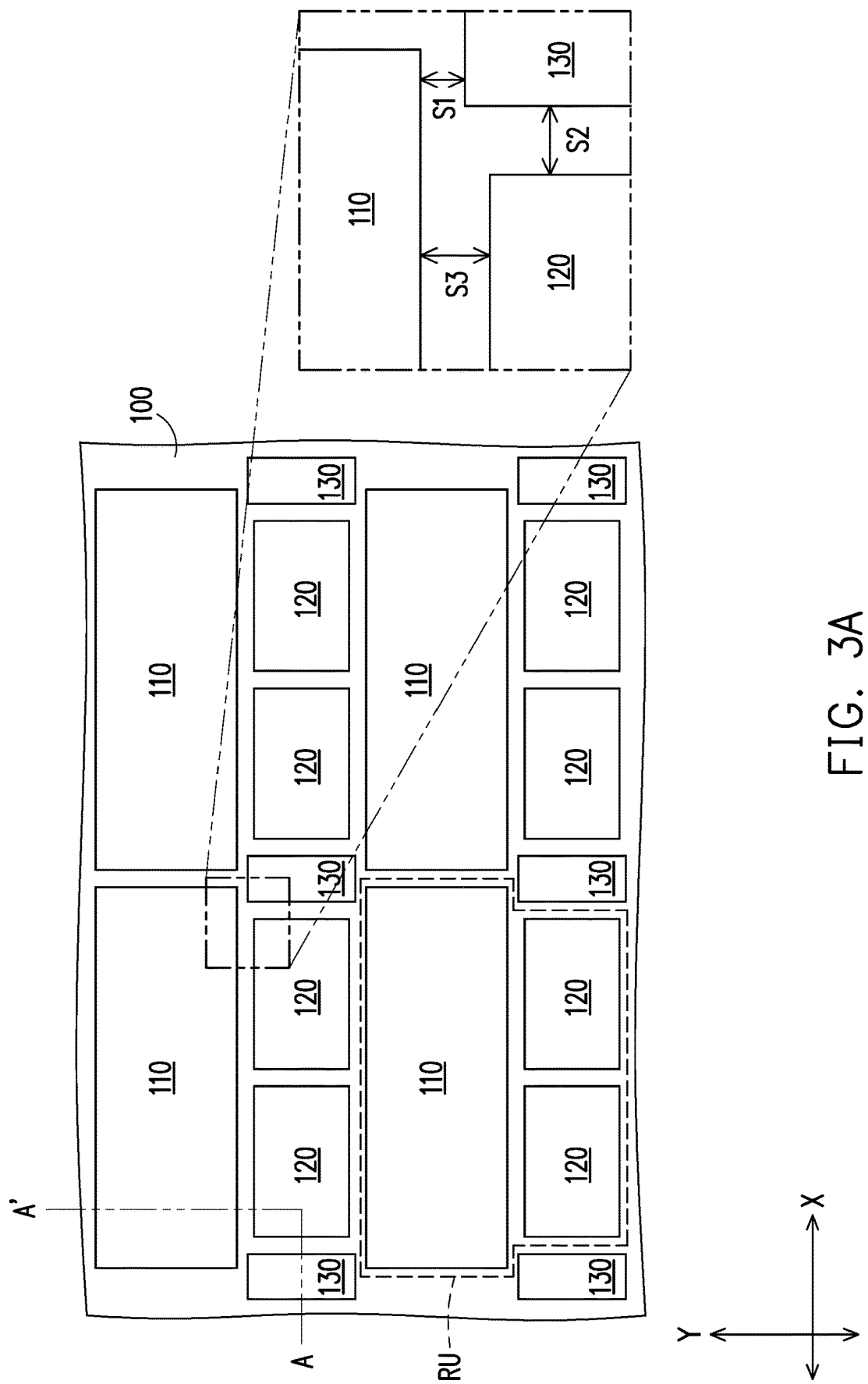
FIG. 3A through FIG. 3D are exemplary top views of FIG. 2B, FIG. 2D, FIG. 2H and FIG. 2J, respectively. The diagrams illustrated in FIG. 2B, FIG. 2D, FIG. 2H and FIG. 2J are respectively an enlarged cross-sectional view along line A-A' shown in FIG. 3A through FIG. 3D.

Referring to FIG. 1, FIG. 2B and FIG. 3A, step S102 is performed, and first semiconductor devices 110, second semiconductor devices 120 and dummy dies 130 are placed on the carrier 100. It should be noted that, FIG. 2B is an enlarged cross-sectional view along line A-A' shown in FIG. 3A, thus only shows one of the first semiconductor devices 110, one of the second semiconductor devices 120 and one of the dummy dies 130. As shown in FIG. 3A, in some embodiments, the first semiconductor devices 110 and the second semiconductor devices 120 placed on the carrier 100 can be arranged as an array of repetitive units RU having rows extending along a direction X and columns extending a direction Y. Each of these repetitive units RU may include one of the first semiconductor devices 110 and a plurality of the second semiconductor devices 120 (e.g., two of the second semiconductor devices 120) arranged along a side (e.g., a long side) of the first semiconductor device 110. Along a row of the repetitive units RU, the first semiconductor devices 110 are arranged along a direction parallel to a direction along which the second semiconductor devices 120 are arranged. Along a column of the repetitive units RU, each group of the second semiconductor devices 120 (e.g., two of the second semiconductor devices 120) are located between adjacent first semiconductor devices 110. In some embodiments, the dummy dies 130 are respectively placed between adjacent repetitive units RU arranged along the direction X. In these embodiments, each dummy die 130 may be located between adjacent second semiconductor devices 120 from these adjacent repetitive units RU. By disposing the dummy dies 130, a space around the first semiconductor devices 110 and the second semiconductor devices 120 are partially occupied, thus a volume of an encapsulant to be filled in this space (e.g., the encapsulant 132 as illustrated with reference to FIG. 2C) is reduced. Therefore, a stress resulted from coefficient of thermal expansion (CTE) mismatch between the encapsulant and the redistribution structure formed over the encapsulant (e.g., the encapsulant 132 and the redistribution structure 134 as shown in FIG. 2E) can be reduced, and issues including cracking and/or delamination of the encapsulant can be avoided. Furthermore, in some embodiments, the dummy dies 130 include a piece of rigid material, and a mechanical strength of the eventually formed semiconductor package (e.g., the semiconductor package 10 as shown in FIG. 2J) can be improved.

As shown in an enlarged view enclosed by a dash line in FIG. 3A, in some embodiments, a spacing S1 between each dummy die 130 and an adjacent first semiconductor device 110, a spacing S2 between each dummy die 130 and an adjacent second semiconductor device 120 as well as a spacing S3 between each first semiconductor device 110 and an adjacent second semiconductor device 120 are respectively at least two times of a particle size of the fillers in the encapsulant to be filled among the first semiconductor devices 110, the second semiconductor devices 120 and the dummy dies 130 in the following step (e.g., the fillers 132b in the encapsulant 132 as shown in FIG. 2C). In these embodiments, the encapsulant having the fillers can be better filled in the space among the dummy dies 130, the first semiconductor devices 110 and the second semiconductor devices 120. For instance, the spacing S1, the spacing S2 and the spacing S3 may respectively be 2 to 4 times of the particle size of the fillers in the encapsulant. In addition, in some embodiments, a length of the dummy die 130 along the direction Y is greater than a length of the second semiconductor device 120 along the same direction Y, and substantially the whole second semiconductor device 120 is laterally overlapped with an adjacent dummy die 130. As such, the dummy dies 130 can more effectively prevent the cracking and/or delamination prone to occur at the sides of the second semiconductor devices 120 facing toward the dummy dies 130. In these embodiments, the spacing S1 between each dummy die 130 and an adjacent first semiconductor device 110 is shorter than the spacing S3 between each second semiconductor device 120 and an adjacent first semiconductor device 110. For instance, a ratio of the spacing S3 with respect to the spacing S1 may be greater than 1, and less than or equal to 10. However, those skilled in the art may adjust the spacings S1, S2 and S3 as well as the dimensions of the first semiconductor devices 110, the second semiconductor devices 120 and the dummy dies 130 upon process requirements, the present disclosure is not limited thereto.

In some embodiments, the first semiconductor devices 110 are semiconductor dies. For instance, the first semiconductor devices 110 may be logic dies, such as multifunctional logic dies for high performance computing (HPC) applications. As shown in FIG. 2B, each of the first semiconductor devices 110 may have a plurality of conductive pads 112 at its active side, and the conductive pads 112 are electrically connected to interconnections and a plurality of electronic devices (both not shown) formed below the conductive pads 112. The conductive pads 112 face away from the carrier 100, and each of the conductive pads 112 is overlapped with an opening of a passivation pattern 114 formed over the conductive pads 112. A plurality of conductive pillars 116 stand on the portions of the conductive pads 112 overlapped with the openings of the passivation pattern 114, and electrically connected to the underlying conductive pads 112. A polymer layer 118 is formed over the passivation pattern 114, and covers sidewalls and top surfaces of the conductive pillars 116. A CTE mismatch between the polymer layer 118 and insulating layers in the redistribution structure to be formed over the first semiconductor devices 110 in the following step (e.g., the dielectric layers 136 in the redistribution structure 134 as shown in FIG. 2E) is less than a CTE mismatch between the encapsulant and the insulating layers in the redistribution structure (e.g., the encapsulant 132 as shown in FIG. 2C and the dielectric layers 136 in the redistribution structure 134 as shown in FIG. 2E). Accordingly, stress caused by CTE mismatch is less likely to be induced around the first semiconductor devices 110, thus cracking and/or delamination of the encapsulant around the first semiconductor devices 110 can be avoided. For instance, a material of the polymer layer 118 includes polybenzoxazole (PBO), high temperature PBO, polyimide (PI), Ajinomoto build-up film (ABF), the like or combinations thereof.

As shown in FIG. 2B, in some embodiments, the second semiconductor devices 120 respectively include a stack of memory dies 121 and a control die 122 disposed over the stack of memory dies 121. For instance, the memory dies 121 may be high bandwidth memory (HBM) dies, whereas the control die 122 may be a logic die. An underfill UF (such as epoxy resin) may be filled between vertically adjacent memory dies 121, and between the stack of memory dies 121 and the control die 122. Moreover, the stack of memory dies 121 may be laterally encapsulated by an encapsulant MC. In some embodiments, manners such as mircro-bump connection, hybrid bonding connection or the like can be used to connect the memory dies 121, and to connect the memory dies 121 with the control die 122. In addition, in some embodiments, through substrate vias (TSV, not shown) are formed in the control die 122 and at least some of the memory dies 121, for realizing communications between the control die 122 and the memory dies 121. In certain cases, active sides of the memory dies 121 and the control die 122, at which electronic devices and interconnections (both not shown) are formed, face away from the carrier 100. A plurality of conductive pads 124 may be formed over the control die 122, and the conductive pads 124 are respectively overlapped with an opening of a passivation pattern 126 formed over the conductive pads 124 and the control die 122. A plurality of conductive pillars 128 stand on the portions of the conductive pads 124 overlapped with the openings of the passivation pattern 126, and are electrically connected to the underlying conductive pads 124. In some embodiments, the second semiconductor device 120 does not include a polymer layer that is formed over the passivation pattern 126 and laterally surrounding the conductive pillars 124. In these embodiments, stress is prone to be induced around the second semiconductor devices 120. However, in alternative embodiments, a polymer layer (not shown) is formed over the passivation pattern 126, and laterally surrounds the conductive pillars 128. In these alternative embodiments, the afore-mentioned stress can be reduced.

On the other hand, in some embodiments, the dummy dies 130 are free of electronic devices and interconnections. In these embodiments, the dummy dies 130 may respectively be a rigid bulk material. In this way, not only a volume of the encapsulant to be formed in the following step (e.g., the encapsulant 132 as shown in FIG. 2C) can be reduced by disposing the dummy dies 130, a mechanical strength of the eventually formed semiconductor package (e.g., the semiconductor package 10 as shown in FIG. 2J) can be improved as a result of the rigidity of the dummy dies 130. In some embodiments, a Young's modulus of the dummy dies 130 is greater than a Young's modulus of the encapsulant (e.g., the encapsulant 132 as shown in FIG. 2C). For instance, the Young's modulus of the dummy dies 130 may range from 70 GPa to 188 GPa, whereas the Young's modulus of the encapsulant 132 may range from 0.05 GPa to 30 GPa. In some embodiments, the rigid bulk material is a semiconductor material, such as silicon. Alternatively, the rigid bulk material may be a metal (e.g., copper) or an inorganic dielectric material (e.g., glass or dielectric core of a package substrate). Regarding a height of the dummy dies 130, a ratio of the height $H_{130}$ of the dummy dies 130 with respect to a height $H_{120}$ of the second semiconductor devices 120 (measured from a back side of the second semiconductor device 120 to top surfaces of the conductive pillars 128) may range from 0.5 to 1, and a ratio of the height $H_{130}$ of the dummy dies 130 with respect to a height $H_{110}$ of the first semiconductor devices 110 (measured from a back side of the first semiconductor device 110 to top surfaces of the conductive pillars 114) may range from 0.5 to 1 as well.

Referring to FIG. 1 and FIG. 2C, step S104 is performed, and the first semiconductor devices 110, the second semiconductor devices 120 and the dummy dies 130 are encapsulated by an encapsulant 132. In some embodiments, the encapsulant 132 is not only filled in a space among the first semiconductor devices 110, the second semiconductor devices 120 and the dummy dies 130, but also formed over the first semiconductor devices 110, the second semiconductor devices 120 and the dummy dies 130. As such, the first semiconductor devices 110, the second semiconductor devices 120 and the dummy dies 130 are currently buried in the encapsulant 132. In some embodiments, the encapsulant 132 includes a base material 132a and a plurality of fillers 132b distributed in the base material 132a. For instance, the base material 132a may include epoxy, curing agent, stress relieving agent, catalyst, the like or combinations thereof, whereas the fillers 132b may be formed of silica, $Al_2O_3$, the like or combinations thereof. In those embodiments where the spacings S1, S2 and S3 (as shown in FIG. 3A) among the first semiconductor devices 110, the second semiconductor devices 120 and the dummy dies 130 are respectively at least two times of a particle size of the fillers 132b in the encapsulant 132, the encapsulant 132 can be better filled in the space among the first semiconductor devices 110, the second semiconductor devices 120 and the dummy dies 130. For instance, the particle size of the fillers 132b may range from 0.5 µm to 40 µm, or be greater than 40 µm.

Figure 2D:
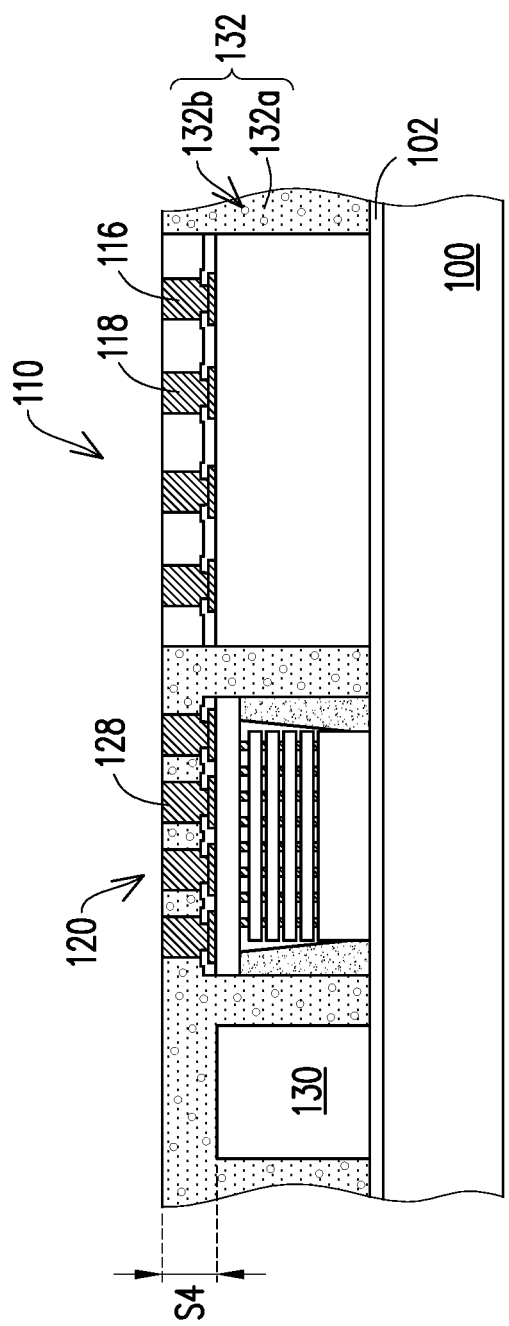

Referring to FIG. 1, FIG. 2D, step S106 is performed, and a top portion of the encapsulant 132 covering top surfaces of the first semiconductor devices 110, the second semiconductor devices 120 and the dummy dies 130 is removed. In this way, the conductive pillars 116 and the polymer layer 118 of the first semiconductor devices 110 as well as the conductive pillars 128 of the second semiconductor devices 120 are exposed. In some embodiments, top portions of the conductive pillars 116, the polymer layer 118 and the conductive pillars 128 may be removed along with the top portion of the encapsulant 132. In other words, heights of the conductive pillars 116 and 128 as well as a thickness of the polymer layer 132 may decrease while removing the top portion of the encapsulant 132. After removing the top portion of the encapsulant 132, the exposed top surfaces of the conductive pillars 116, the polymer layer 118 and the conductive pillars 128 may be substantially coplanar with each other. On the other hand, as shown in FIG. 2D, the dummy dies 130 may still be buried in the encapsulant 132. In some embodiments, a spacing S4 between top surfaces of the dummy dies 130 and the top surface of the encapsulant 132 ranges from 5 µm to 400 µm. Alternatively, the dummy dies 130 has a height substantially equal to heights of the first semiconductor devices 110 and the second semiconductor devices 120, and top surfaces of the dummy dies 130 may be exposed after removing the top portion of the encapsulant 132. In some embodiments, a planarization process is used for removing the top portion of the encapsulant 132. For instance, the planarization process may include a chemical mechanical polishing (CMP) process, a grinding process, an etching process or combinations thereof.

Figure 3B:
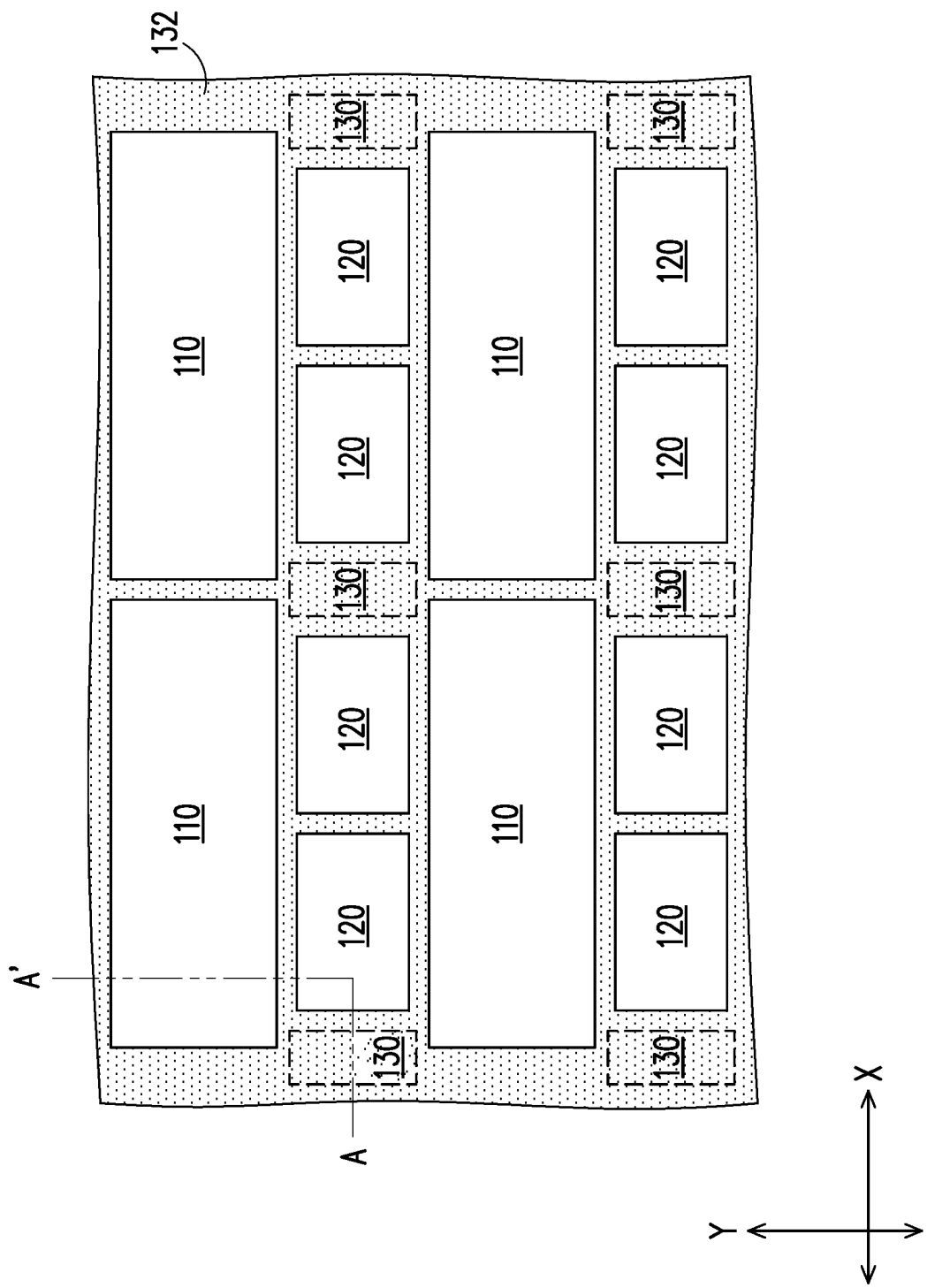

As shown in FIG. 3B that illustrates an exemplary top view of the current structure, the first semiconductor devices 110 and the second semiconductor devices 120 are laterally surrounded by the encapsulant 132, and are depicted by solid lines. On the other hand, in some embodiments, the dummy dies 130 are stilled buried in the encapsulant 132, and are depicted by dash lines. It should be noted that, for conciseness, the fillers 132b are omitted in FIG. 3B.

Referring to FIG. 1 and FIG. 2E, step S108 is performed, and a redistribution structure 134 is formed over the reconstructed wafer structure as shown in FIG. 2D and FIG. 3B. In some embodiments, the redistribution structure 134 spans over substantially the whole exposed surface of the reconstructed wafer structure, and the first semiconductor devices 110, the second semiconductor devices 120 and the dummy dies 130 are covered by the redistribution structure 134. The redistribution structure 134 may include a stack of dielectric layers 136 (e.g., a stack of three dielectric layers 136) and a plurality of redistribution elements 138 formed in the stack of dielectric layers 136. The redistribution elements 138 may include conductive traces and conductive vias. The conductive traces respectively extend along a top surface of one of the dielectric layers 136, whereas the conductive vias respectively penetrate at least one dielectric layer 136 and connect to at least one conductive trace. The redistribution elements 138 are electrically connected to the conductive pillars 116 of the first semiconductor devices 110 and the conductive pillars 128 of the second semiconductor devices 120, and fan out from ranges of the first semiconductor devices 110 and the second semiconductor devices 120 to a range of the reconstructed wafer structure. On the other hand, the redistribution structure 134 is electrically isolated from the dummy dies 130. In some embodiments, the redistribution structure 134 may be separated from the dummy dies 130 by a portion of the encapsulant 132 in between. In some embodiments, a material of the dielectric layers 136 may include silicon oxide, silicon nitride, a photosensitive polymer material (e.g., polybenzoxazole (PBO), benzocyclobutene (BCB), polyimide (PI) etc.), a low-k dielectric material, the like or combinations thereof, whereas a material of the redistribution elements 138 may include Cu, Ti, W, Al, the like or combinations thereof. In addition, in some embodiments, a method for forming the dielectric layers 136 includes a solution process (e.g., a spin coating process) or a chemical vapor deposition (CVD) process, whereas a method for forming the redistribution elements 138 includes a plating process (e.g., an electroplating process or an electroless plating process), a physical vapor deposition (PVD) process or a combination thereof.

Figure 2F:
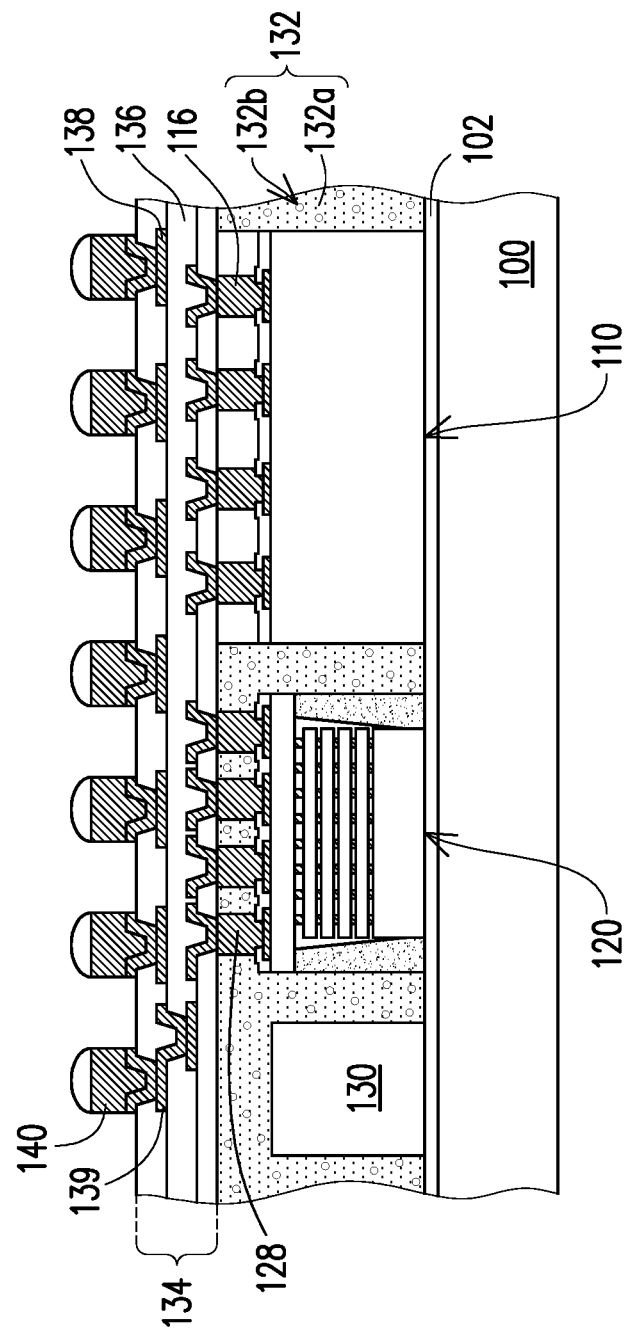

Referring to FIG. 1 and FIG. 2F, step S110 is performed, and electrical connectors 140 are formed over the redistribution structure 134. The electrical connectors 140 are electrically connected to the conductive pillars 116 and 128 through the redistribution elements 138 in the redistribution structure 134. In those embodiments where the redistribution elements 138 fan out from the ranges of the first semiconductor devices 110 and the second semiconductor devices 120 to the range of the reconstructed wafer structure, a spacing between adjacent electrical connectors 140 may be greater than a spacing between adjacent conductive pillars 116 and a spacing between adjacent conductive pillars 128. A method for forming the electrical connectors 140 may include forming openings in the topmost dielectric layer 136, so as to expose some of the redistribution elements 138. Thereafter, the electrical connectors 140 are formed over the exposed redistribution elements 138. In some embodiments, under bump metallization (UBM) layers 139 are formed in the openings of the topmost dielectric layer 136 before forming the electrical connectors 140, such that the UBM layers 139 are electrically connected between the redistribution elements 138 and the electrical connectors 140. In some embodiments, as shown in FIG. 2F, the electrical connectors 140 are pillar bumps, such as copper pillar bumps (CPB). A method for forming the pillar bumps may include one or more plating process (e.g., electroplating process or electroless plating process) and a reflow process. In alternative embodiments, the electrical connectors 140 may be solder bumps, controlled collapse chip connection (C4) bumps, ball grid array (BGA) bumps, micro-bumps or the like. The UBM layers 139 may be formed of Cr, Cu, Ti, W, Ni, Al, the like or combinations thereof, and a method for forming the UBM layers 139 may include a PVD process, a plating process (e.g., electroplating process or electroless plating process) or a combination thereof.

Figure 2G:
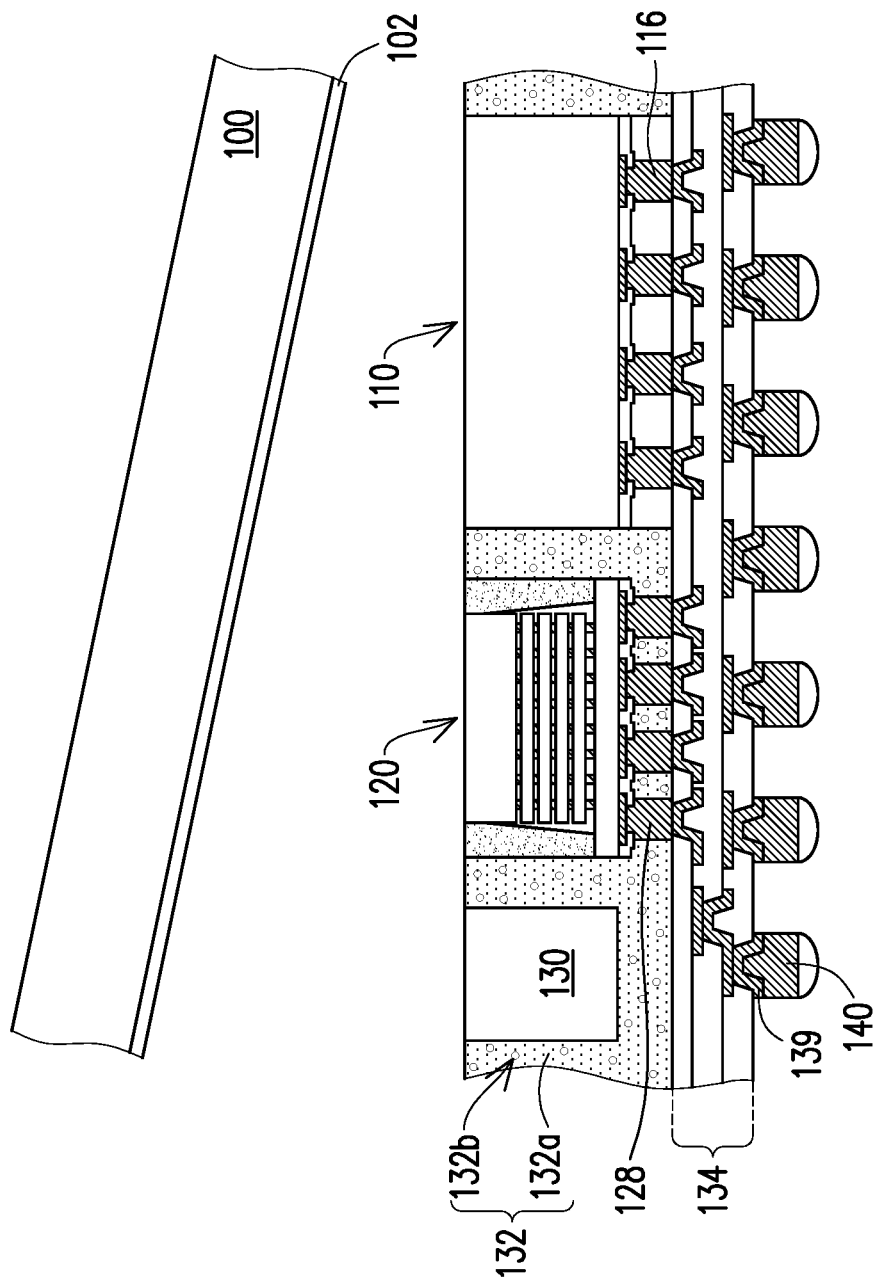

Referring to FIG. 1 and FIG. 2G, step S112 is performed, and the carrier 100 is detached from the reconstructed wafer structure formed thereon. In those embodiments where the adhesive layer 102 is a LTHC release layer or a thermal release layer, the adhesive layer 102 loses its adhesiveness while being exposed to light or heat. Once the adhesive layer 102 loses its adhesiveness, the carrier 100 can be detached from the first semiconductor devices 110, the second semiconductor devices 120, the dummy dies 130 and the encapsulant 132 along with the adhesive layer 102. In some embodiments, another carrier (not shown) may be temporarily attached to the electrical connectors 140 before detaching the carrier 100. As the carrier 100 has been detached from the reconstructed wafer formed thereon, the back sides of the first semiconductor devices 110, the second semiconductor devices 120, the dummy dies 130 and the encapsulant 132 that face away from the redistribution structure 134 may be exposed.

Figure 2H:
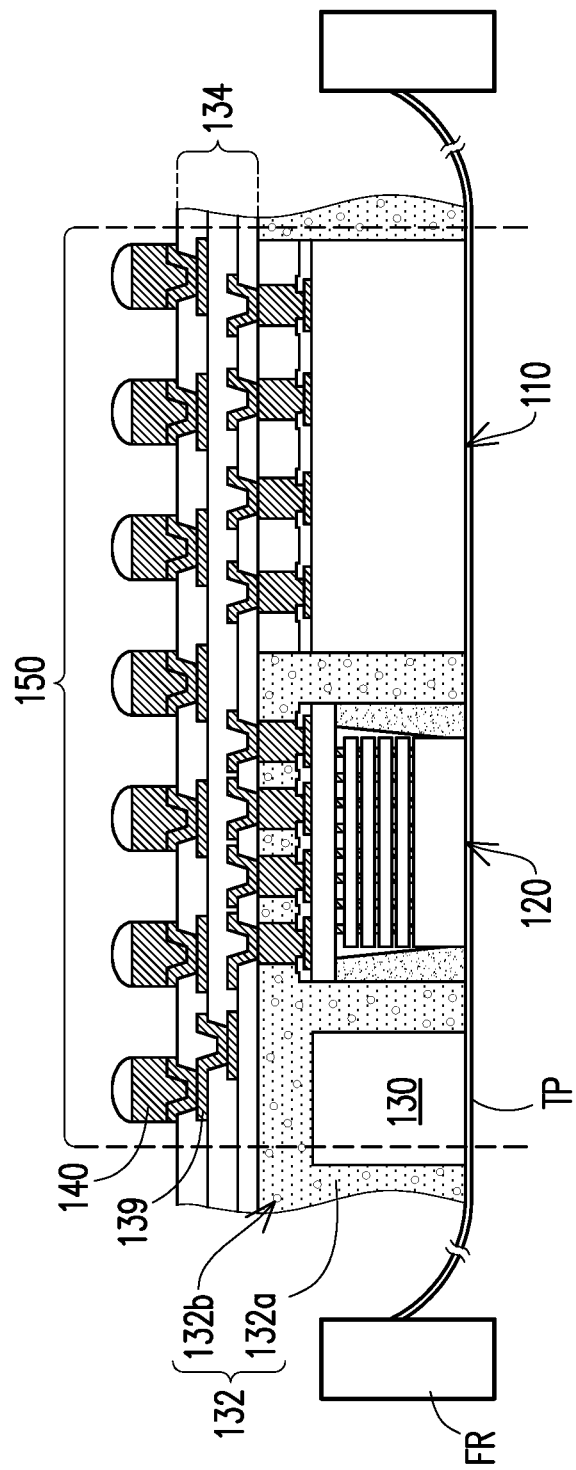
Figure 3C:
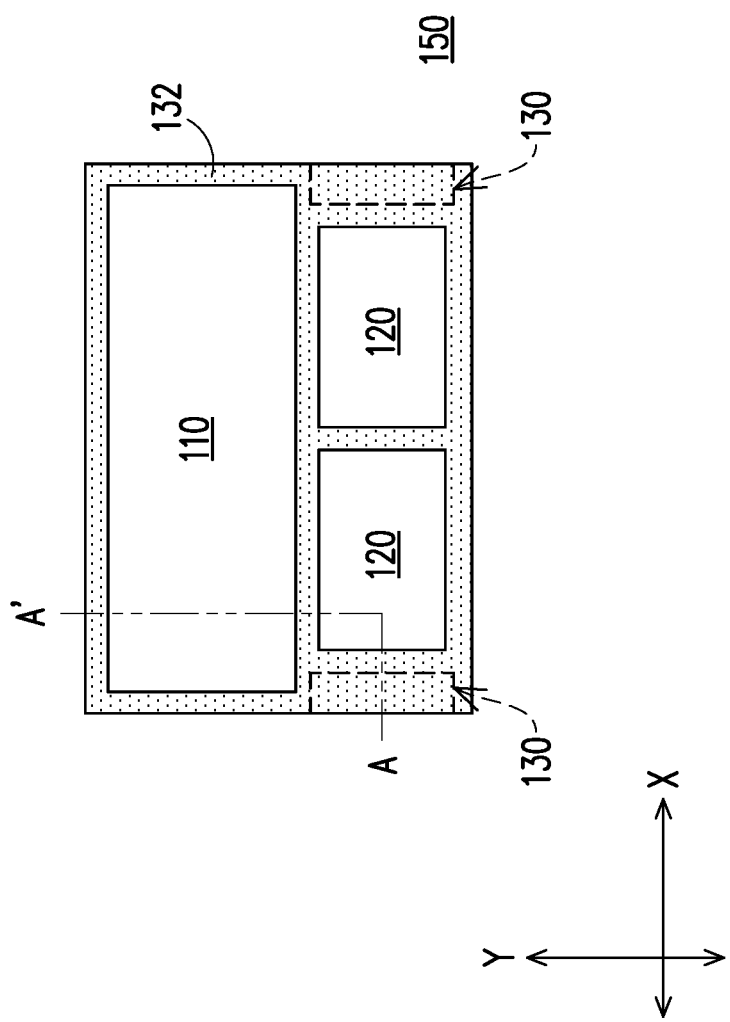

Referring to FIG. 1, FIG. 2H and FIG. 3C, step S114 is performed, and the current structure is singulated into a plurality of package structures 150. It should be noted that, only one of the package structures 150 is depicted in each of FIG. 2H and FIG. 3C, and FIG. 2H is an enlarged cross-sectional view along line A-A' shown in FIG. 3C. As shown in FIG. 3C, each package structure 150 includes one of the first semiconductor devices 110 and two or more of the second semiconductor devices 120 (e.g., two of the second semiconductor devices 120) arranged along a side of the first semiconductor device 110. In addition, each package structure 150 further includes at least one of the dummy dies 130 located aside the second semiconductor devices 120. For instance, each package structure 150 includes two dummy dies 130 located at opposite sides of the two second semiconductor devices 120, such that the dummy dies 130 and the second semiconductor devices 120 are arranged along the same side of the first semiconductor device 110. In some embodiments, scribe lines along which the singulation process is performed (i.e., the contour of the package structure 150 as shown in FIG. 3C) penetrate the dummy dies 130, and the dummy dies 130 are each partially removed during the singulation process. In these embodiments, a sidewall of each dummy die 130 is substantially coplanar with a sidewall of the encapsulant 132, and exposed at a side of the package structure 150. For instance, the sidewall of each dummy die 130 facing away from the two second semiconductor devices 120 is substantially coplanar with a sidewall of the encapsulant 132 extending along the direction Y. In some embodiments, the singulation process includes a dicing process, a sawing process, a laser ablation process, an etching process or combinations thereof. In addition, in some embodiments, the structure shown in FIG. 2G is flipped over and the back sides of the first semiconductor devices 110, the second semiconductor devices 120, the dummy dies 130 and the encapsulant 132 are attached to a tape TP before the singulation process. In these embodiments, the tape TP may be connected to a frame FR.

Figure 2I:
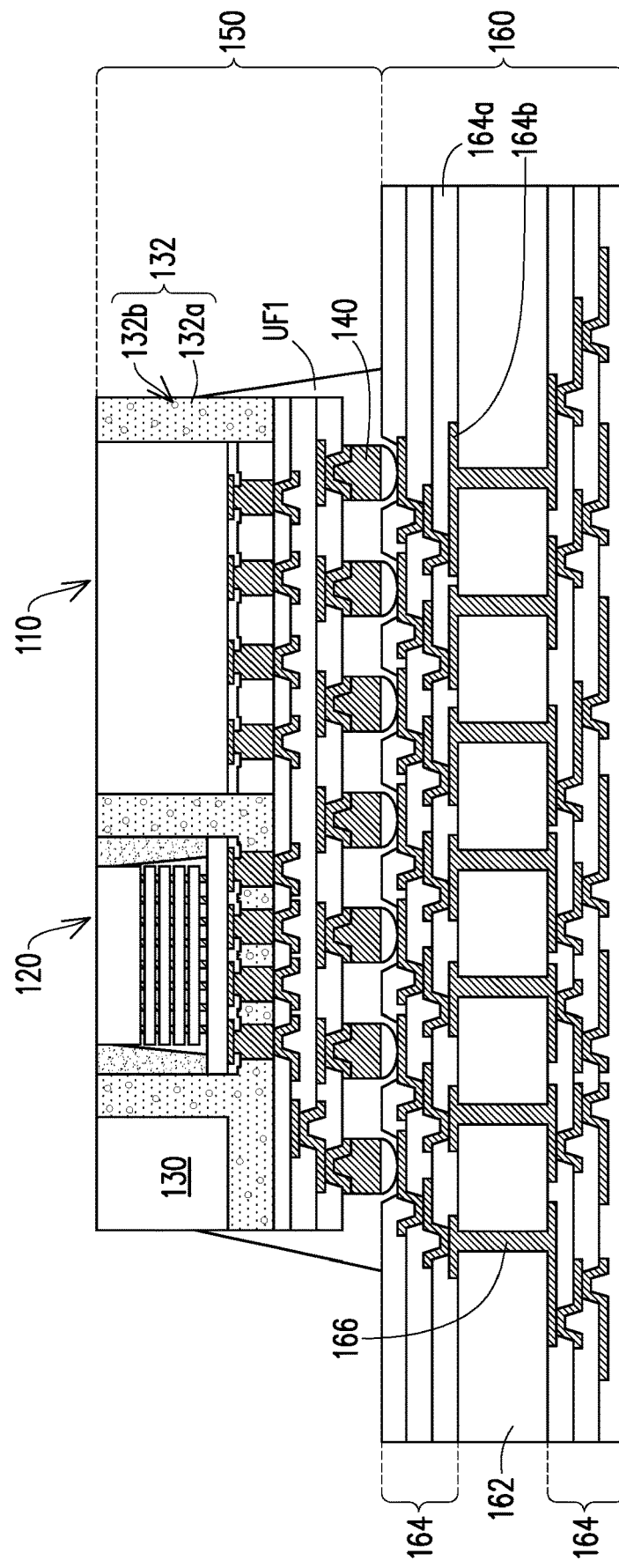

Referring to FIG. 1 and FIG. 2I, step S116 is performed, and the package structure 150 is attached to a package substrate 160 through the electrical connectors 140. In some embodiments, the package substrate 160 includes a core substrate 162, routing structures 164 formed at opposite sides of the core substrate 162 and conductive through vias 166 penetrating through the core substrate 162. The routing structures 164 respectively include a stack of dielectric layers 164a and a plurality of routing elements 164b formed in the stack of dielectric layers 164a. The routing elements 164b may include conductive traces and conductive vias. The conductive traces respectively extend along a surface of one of the dielectric layers 164a or a surface of the core substrate 162, whereas the conductive vias respectively penetrate one of the dielectric layers 164a and connect to at least one of the conductive traces. Some of the conductive traces that are closest to the core substrate 162 are connected to the conductive through vias 166, such that the conductive through vias 166 can be electrically connected to the routing elements 164b in the routing structures 164 at opposite sides of the core substrate 162. In addition, the electrical connectors 140 are attached to some of the routing elements 164b closest to the package structure 150, so as to be electrically connected to the routing structures 164. In some embodiments, a material of the core substrate 162 includes Ajinomoto build-up film (ABF), a pre-impregnated composite fiber (prepreg) material, an epoxy, a molding compound, an epoxy molding compound, a fiberglass-reinforced resin, a printed circuit board (PCB) material, polyimide, paper, glass fiber, non-woven glass fabric, glass, ceramic, the like or combinations thereof. Similarly, a material of the dielectric layers 164a may include one of those materials for the core substrate 162, and the dielectric layers 164a may respectively formed by a method including a lamination process, a coating process or other suitable process. In addition, a material of the routing elements 164b and the conductive through via 166 may include Cu, Ni, Al, other conductive materials, the like or combinations thereof, and methods for forming the routing elements 164b and the conductive through vias 166 may include a PVD process, a plating process (e.g., an electroplating process or an electroless plating process) or a combination thereof.

In some embodiments, an underfill UF1 is filled in a space between the package structure 150 and the package substrate 160 after the attachment of the package structure 150. The electrical connectors 140 are laterally surrounded by the underfill UF1. In some embodiments, the underfill UF1 further extends onto a sidewall of the package structure 150.

For instance, a material of the underfill UF1 may include epoxy resin, silica rubber, the like or combinations thereof. In certain cases, the material of the underfill UF1 may be identical to the material of the base material 132a of the encapsulant 132.

Figure 3D:
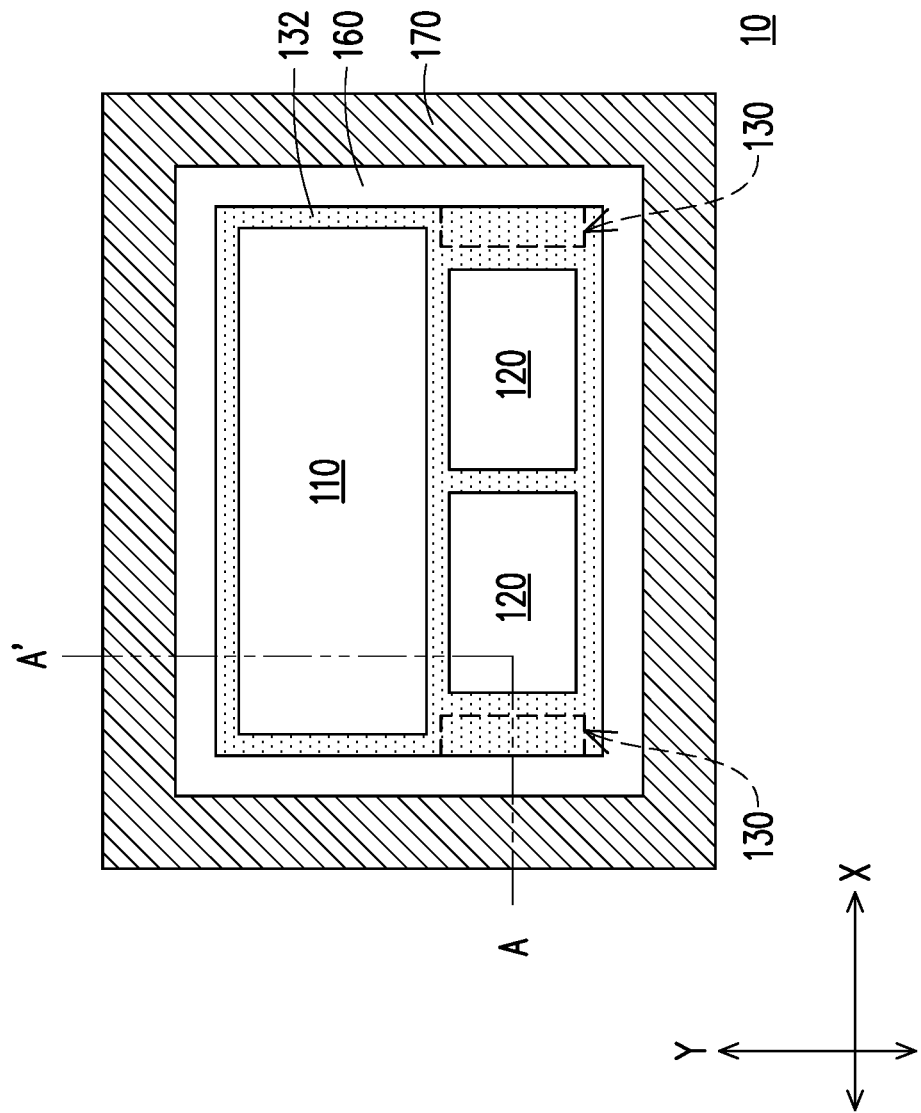

Referring to FIG. 1, FIG. 2J and FIG. 3D, step S118 is performed, such that electrical connectors 168 are formed, and a heat dissipation ring 170 is provided on the package substrate 160. It should be noted that, the underfill UF1 is omitted in FIG. 3D, and FIG. 2J is an enlarged cross-sectional view along line A-A' shown in FIG. 3D. As shown in FIG. 2J, the electrical connectors 168 are formed at the exposed surface of the routing structure 164 facing away from the attached package structure 150, and electrically connected to the routing elements 164b of this routing structure 164. In addition, UBM layers 167 may be formed between these routing elements 164b and the electrical connectors 168. In some embodiments, the electrical connectors 168 are BGA bumps. In alternative embodiments, the electrical connectors 168 may be solder bumps, C4 bumps, micro-bumps or the like. On the other hand, a material of the UBM layers 167 may include Cr, Cu, Ti, W, Ni, Al, the like or combinations thereof. As shown in FIG. 2J and FIG. 3D, the heat dissipation ring 170 is provided on the routing structure 164 facing toward the attached package structure 150, and the attached package structure 150 is laterally surrounded by the heat dissipation ring 170. In some embodiments, the heat dissipation ring 170 can be regarded as extending along a contour of the package substrate 160. For instance, the package substrate 160 may have a rectangular contour, and a top view shape of the heat dissipation ring 170 may be a rectangular ring. In some embodiments, the heat dissipation ring 170 is attached to the routing structure 164 via an adhesive layer 172. In these embodiments, the adhesive layer 172 may be preliminarily provided on an attaching surface of the heat dissipation ring 170 or the routing structure 164 before the attachment of the heat dissipation ring 170. A material of the heat dissipation ring 170 may be a thermal conductive material, such as metal. For instance, the material of the heat dissipation ring 170 may include steel, Cu, Al, Ag, Ni, the like or combinations thereof. Alternatively, the heat dissipation ring 170 may be made of a ceramic material. In addition, a material of the adhesive layer 172 may include epoxy, silicone, the like or combinations thereof.

Up to here, a semiconductor package 10 is formed. The semiconductor package 10 includes the first semiconductor device 110 and a plurality of the second semiconductor devices 120 arranged along a side of the first semiconductor device 110, and further includes at least one of the dummy dies 130 (e.g., two of the dummy dies 130) located aside these second semiconductor devices 120. The dummy dies 130 occupy some of the space around the first semiconductor device 110 and the second semiconductor devices 120, thus a volume of the encapsulant 132 subsequently filled in this space is reduced. Therefore, a stress resulted from CTE mismatch between the encapsulant 132 and the components formed thereon (e.g., the redistribution structure 134) can be reduced. In addition, in some embodiments, the dummy dies 130 include a rigid bulk material, thus a mechanical strength of the semiconductor package 10 can be improved.

Figure 4:
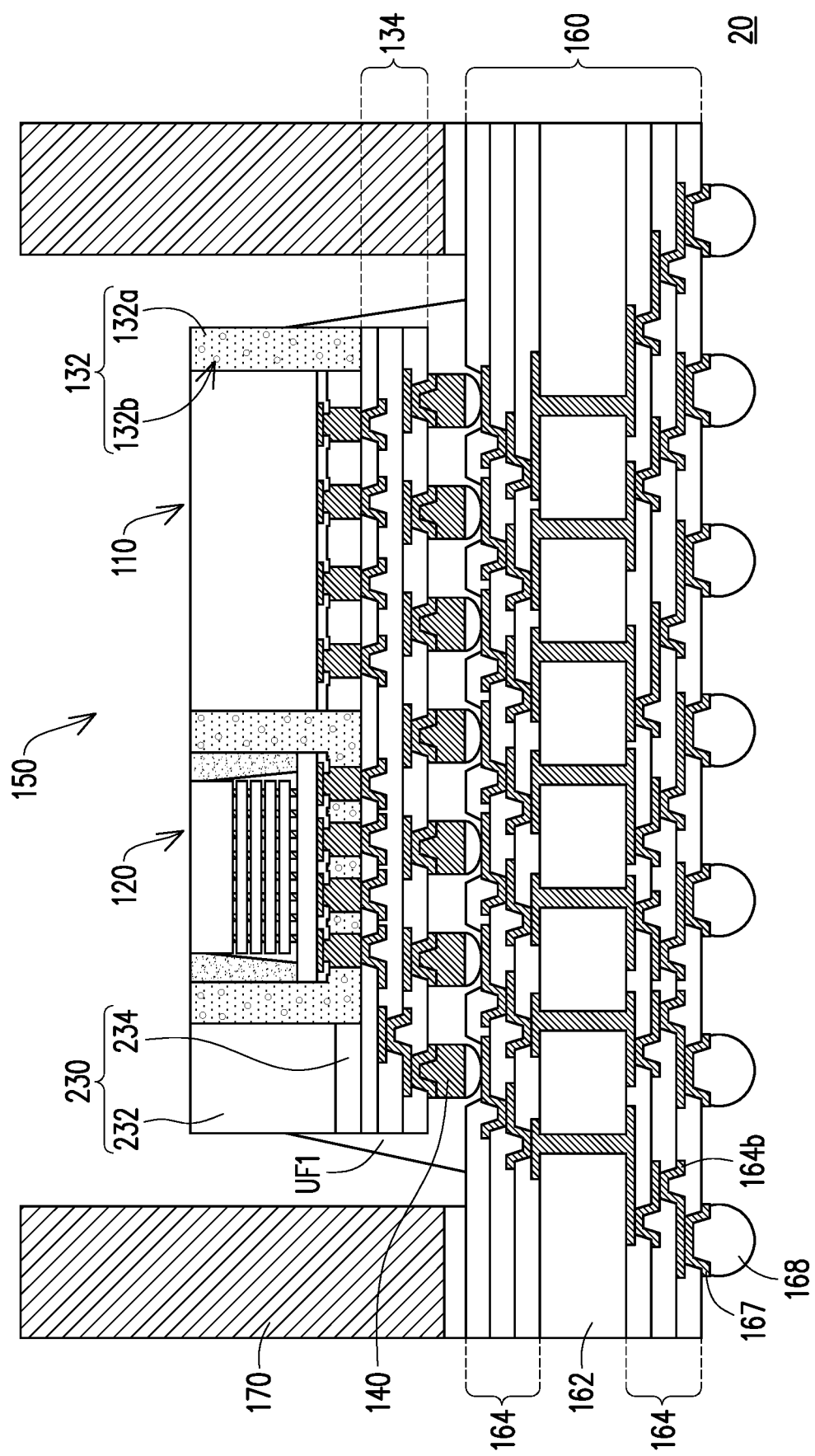
FIG. 4 and FIG. 5 are cross-sectional views of semiconductor packages according to some embodiments in the present disclosure.

FIG. 4 is a cross-sectional view of a semiconductor package 20 according to some embodiments in the present disclosure. The semiconductor package 20 as shown in FIG. 4 is similar to the semiconductor package 10 as shown in FIG. 2J and FIG. 3D. Only difference therebetween will be described, the like or the same parts will not be repeated again.

Referring to FIG. 4, dummy dies 230 respectively include a rigid bulk material 232 and a polymer layer 234 formed on the rigid bulk material 232. After removing the top portion of the encapsulant 132 for exposing the conductive pillars 116 and 128 of the first semiconductor devices 110 and the second semiconductor devices 120 (as the step shown in FIG. 2D), top surfaces of the polymer layers 234 may be exposed. Accordingly, the polymer layers 234 are in contact with the redistribution structure 134 formed on the encapsulant 132 in the following step (as the step shown in FIG. 2E). In some embodiments, the top surfaces of the polymer layers 234 may be substantially coplanar with the top surface of the encapsulant 132. A CTE mismatch between the polymer layer 234 and the dielectric layers 136 in the redistribution structure 134 is less than the CTE mismatch between the encapsulant 132 and the dielectric layers 136 in the redistribution structure 134. Therefore, the stress caused by CTE mismatch at the interface of the reconstructed wafer structure (including the encapsulant 132, the first semiconductor devices 110, the second semiconductor devices 120 and the dummy dies 230) and the redistribution structure 134 can be further reduced, thus problems including cracking and/or delamination of the encapsulant 132 can be further prevented. In some embodiments, the rigid bulk material 232 is such as a semiconductor material (e.g., S1), a metal (e.g., Cu) or an inorganic dielectric material (e.g., glass or dielectric core of a package substrate), whereas a material of the polymer layer 234 includes polybenzoxazole (PBO), high temperature PBO, polyimide (PI), Ajinomoto build-up film (ABF), the like or combinations thereof.

Figure 5:
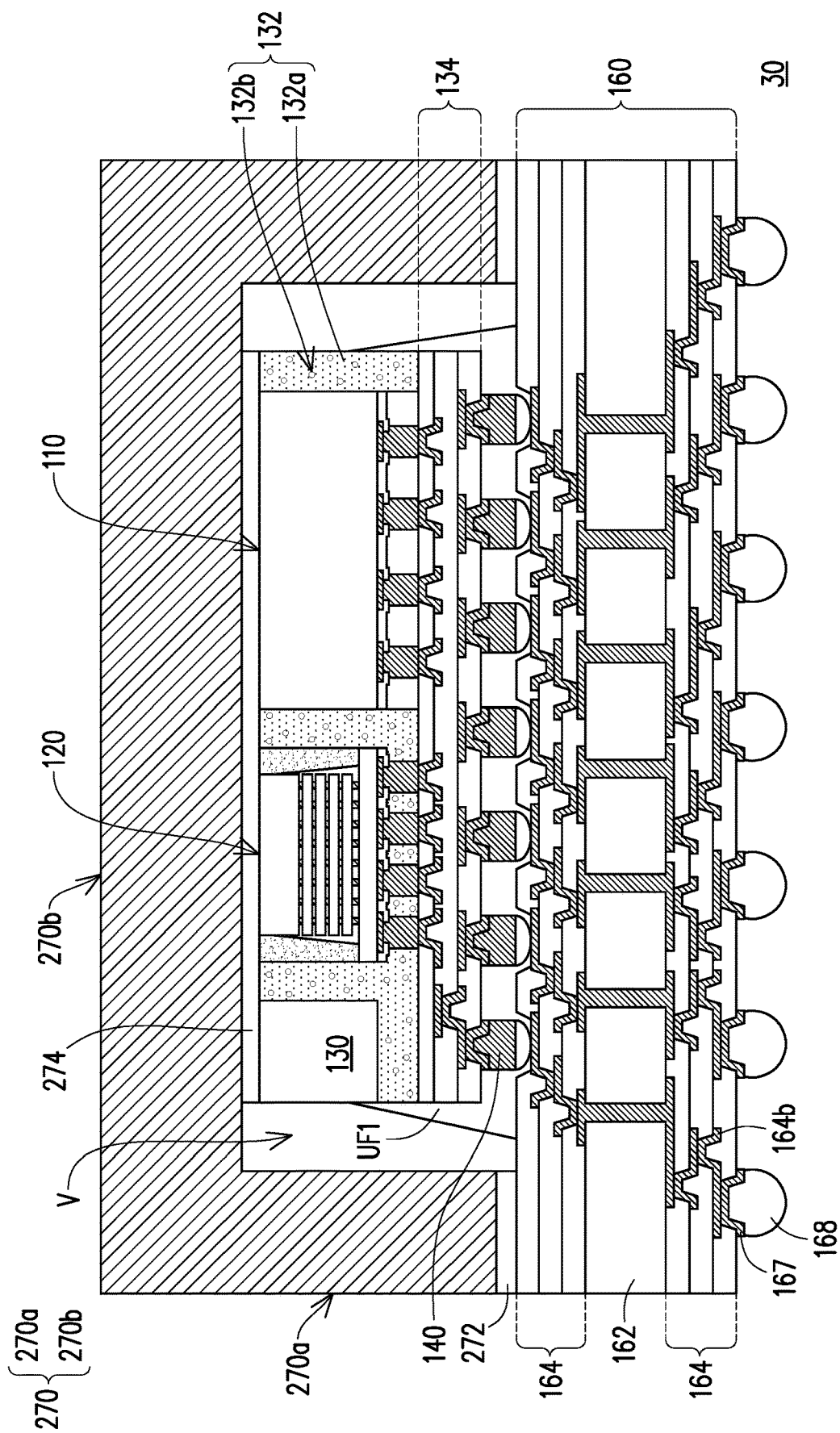

FIG. 5 is a cross-sectional view of a semiconductor package 30 according to some embodiments in the present disclosure. The semiconductor package 30 as shown in FIG. 5 is similar to the semiconductor package 10 as shown in FIG. 2J and FIG. 3D. Only difference therebetween will be described, the like or the same parts will not be repeated again.

Referring to FIG. 2J, FIG. 3D and FIG. 5, the semiconductor package 30 shown in FIG. 5 includes a heat dissipation lid 270 rather than the heat dissipation ring 170 as shown in FIG. 2J and FIG. 3D. In some embodiments, the heat dissipation lid 270 has a wall portion 270a and a capping portion 270b. The wall portion 270a stands on the package substrate 160, and laterally surrounds the package structure 150. The capping portion 270b covers the wall portions 270a and the package structure 150 laterally surrounded by the wall portion 270a. In these embodiments, the package structure 150 can be regarded as being accommodated in a cavity V enclosed by the package substrate 160 and the heat dissipation lid 270. In some embodiments, the wall portion 270a is attached to the package substrate 160 through an adhesive layer 272, whereas the capping portion 270b is attached to the top surface of the package structure 150 though a thermal interfacial layer 274. A material of the heat dissipation lid 270 may be a thermal conductive material, such as metal. For instance, the material of the heat dissipation lid 270 may include steel, Cu, Al, Ag, Ni, the like or combinations thereof. Alternatively, the heat dissipation lid 270 may be made of a ceramic material. In addition, a material of the adhesive layer 272 may include epoxy, silicone, the like or combinations thereof, whereas a material of the thermal interfacial layer 274 may include a composite material containing polymer and metal particles (e.g., silicone mixed with particles, such as alumina particles, zinc oxide particles or silver particles).

Figure 6:
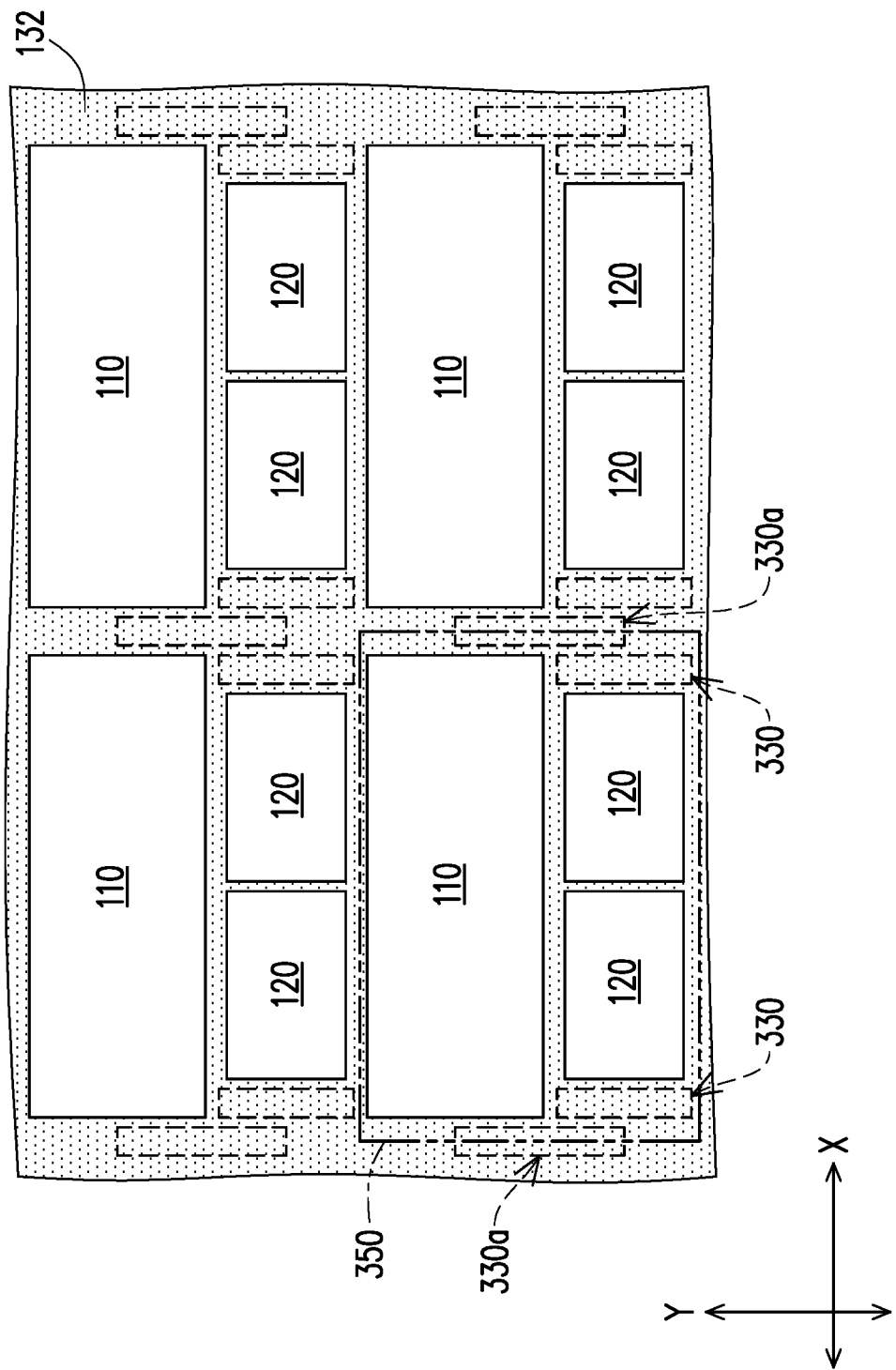
FIG. 6 through FIG. 8 are top views illustrating intermediate structures of semiconductor packages according to some embodiments in the present disclosure.
Figure 7:
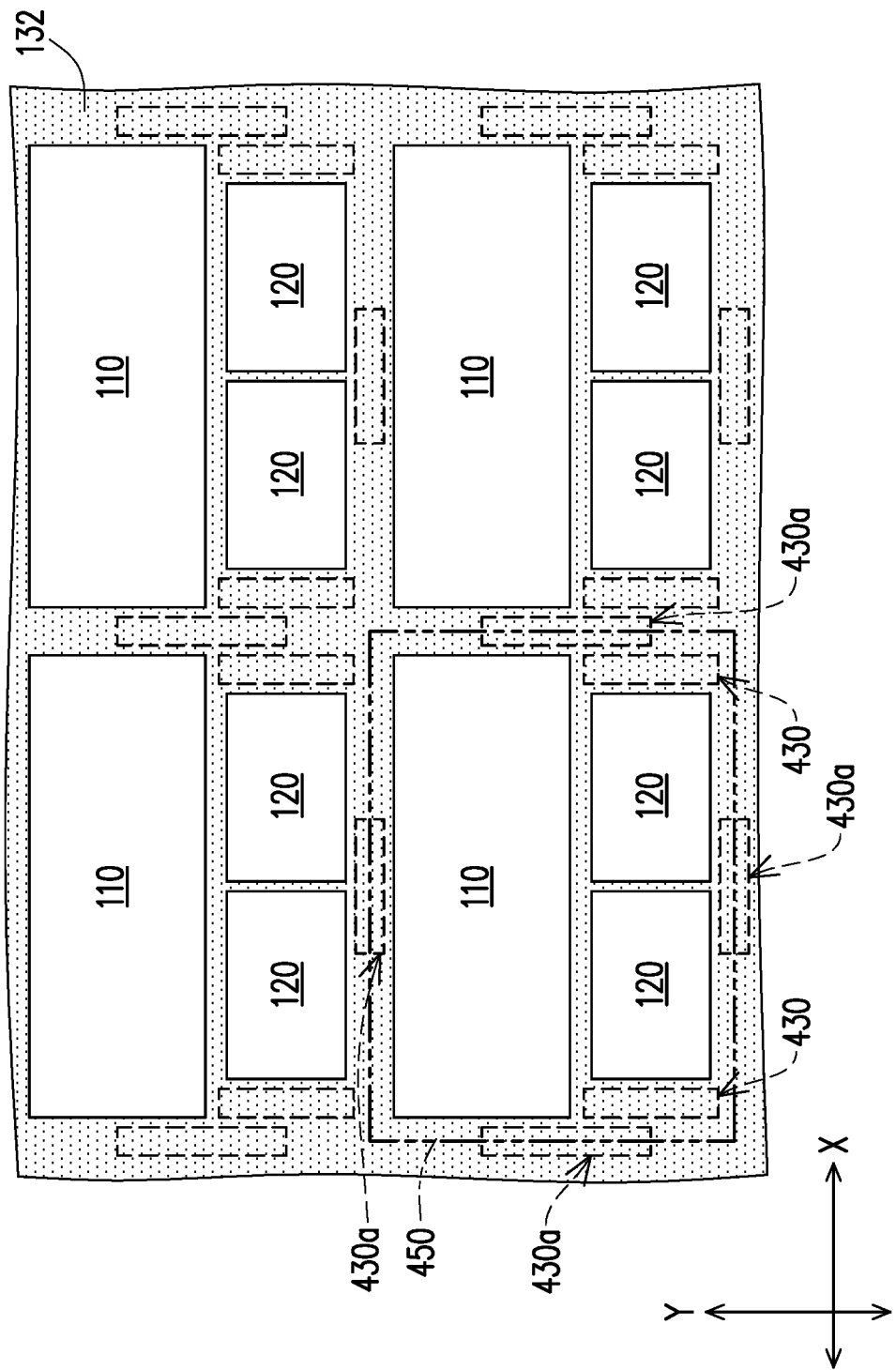
Figure 8:
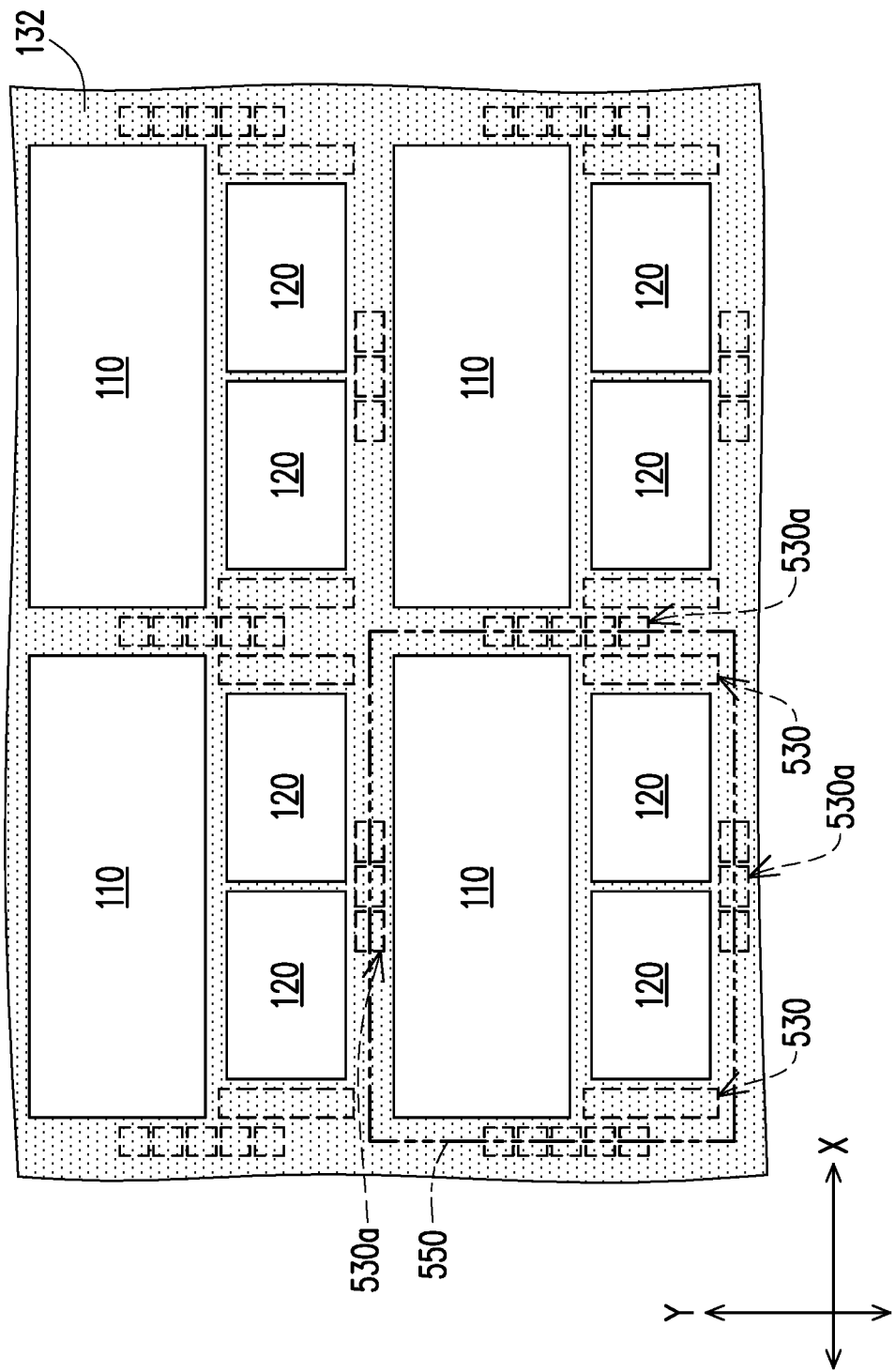

FIG. 6 through FIG. 8 are top views illustrating intermediate structures of semiconductor packages before formation of the redistribution structure 134 according to some embodiments in the present disclosure. The intermediate structures shown in FIG. 6 through FIG. 8 are similar to an intermediate structure as shown in FIG. 3B. Only differences therebetween will be described, the like or the same parts will not be repeated again. It should be noted that, regions respectively enclosed by a dash line as shown in FIG. 6 through FIG. 8 indicate contours of singulated package structures to be formed subsequently, and the dash lines can be regarded as sections of scribe lines along which the singulation process is performed.

Referring to FIG. 6, in some embodiments, a plurality of the second semiconductor devices 120 and at least one dummy die 330 are arranged along a side of each first semiconductor device 110, and additional dummy dies 330a are respectively placed between adjacent first semiconductor devices 110. For instance, two of the second semiconductor devices 120 and two of the dummy dies 330 placed at opposite sides of the two second semiconductor devices 120 are arranged along a side of each first semiconductor device 110 extending along the direction X, and each additional dummy die 330a extends along the direction Y between adjacent first semiconductor devices 110. The additional dummy dies 330a are substantially identical to the dummy dies 330, except that locations (or locations and dimensions) of the additional dummy dies 330a are different from locations (or locations and dimensions) of the dummy dies 330. In some embodiments, a portion of each additional dummy die 330a is located between adjacent first semiconductor devices 110, whereas another portion of each additional dummy die 330a is located between adjacent dummy dies 330. In some embodiments, as shown in the region enclosed by a dash line in FIG. 6 that illustrates a contour of a singulated package structure 350 to be formed subsequently, a portion of each additional dummy die 330a is removed during the singulation process. For instance, the scribe lines, along which the singulation process is performed, penetrate the additional dummy dies 330a along the direction Y. In these embodiments, a sidewall of each additional dummy die 330a is substantially coplanar with a sidewall of the encapsulant 132 in each singulated package structure 350, and exposed at a side of each singulated package structure 350. On the other hand, the dummy die(s) 330 may remain complete within a span of the encapsulant 132 in each singulated package structure 350.

Referring to FIG. 7, in some embodiments, each repetitive unit including one of the dummy dies 110 as well as the second semiconductor device(s) 120 and dummy die(s) 430 arranged along a side of this dummy die 110 is surrounded by a plurality of additional dummy dies 430a. For instance, each repetitive unit including one of the dummy dies 110 as well as two second semiconductor devices 120 and two dummy dies 430 arranged along a side of this first semiconductor device 110 is surrounded by four additional dummy dies 430a. Two of the four additional dummy dies 430a extend along the direction X, whereas the other two of the four additional dummy dies 430a extend along the direction Y. The two additional dummy dies 430a extending along the direction X are arranged along the direction Y, and located at opposite sides of the repetitive unit. On the other hand, the two additional dummy dies 430a extending along the direction Y are arranged along the direction X, and located at opposite sides of the repetitive unit. In some embodiments, as shown in the region enclosed by a dash line in FIG. 7 that illustrates a contour of a singulated package structure 450 to be formed subsequently, a portion of each additional dummy die 430a is removed during the singulation process. For instance, the scribe lines, along which the singulation process is performed, penetrate the additional dummy dies 430a along their extending directions. In these embodiments, a sidewall of each additional dummy die 430a is substantially coplanar with a sidewall of the encapsulant 132 in each singulated package structure 450, and exposed at a side of each singulated package structure 450. On the other hand, the dummy die(s) 430 may remain complete within a span of the encapsulant 132 in each singulated package structure 450.

Referring to FIG. 8, each repetitive unit including one of the dummy dies 110 as well as the second semiconductor device(s) 120 and dummy die(s) 530 arranged along a side of this dummy die 110 is surrounded by a plurality of groups of additional dummy dies 530a. For instance, each repetitive unit including one of the dummy dies 110 as well as two second semiconductor devices 120 and two dummy dies 530 arranged along a side of this first semiconductor device 110 is surrounded by four groups of additional dummy dies 530a. The additional dummy dies 530a in two of the four groups are arranged along the direction X, whereas the additional dummy dies 530a in the other two of the four groups are arranged along the direction Y. The two groups having the additional dummy dies 530a arranged along the direction X are located at opposite sides of the repetitive unit. Similarly, the other two groups having the additional dummy dies 530a arranged along the direction Y are located at another pair of opposite sides of the repetitive unit. The additional dummy dies 530a in each group are laterally separated from one another other. In some embodiments, a spacing between adjacent additional dummy dies 530a in each group is at least two times of a particle size of the fillers in the encapsulant 132 (e.g., the fillers 132b as shown in FIG. 2C), such that the encapsulant 132 can be better filled into the spacing. For instance, the spacing between adjacent additional dummy dies 530a in each group may be 2 to 4 times of the particle size of the fillers in the encapsulant 132. In addition, in some embodiments, a footprint area of each additional dummy die 530a is smaller than a footprint area of each dummy die 530. For instance, a ratio of the footprint area of each dummy die 530 with respect to the footprint of each additional dummy die 530a is greater than 1, and less than or equal to 10. In some embodiments, as shown in the region enclosed by a dash line in FIG. 8 that illustrates a contour of a singulated package structure 550 to be formed subsequently, a portion of each additional dummy die 530a is removed during the singulation process. For instance, the scribe lines, along which the singulation process is performed, penetrate each group of additional dummy dies 530a along an arrangement direction of the additional dummy dies 530a in each group. In these embodiments, a sidewall of each additional dummy die 530a is substantially coplanar with a sidewall of the encapsulant 132 in each singulated package structure 550, and exposed at a side of each singulated package structure 550. On the other hand, the dummy die(s) 530 may remain complete within a span of the encapsulant 132 in each singulated package structure 550.

As above, the semiconductor package according to embodiments of the present disclosure includes a plurality of semiconductor devices and a dummy die, which are laterally separated from one another. The dummy die occupies some of the space around the semiconductor devices, thus a volume of the encapsulant subsequently filled in this space can be reduced. Therefore, a stress resulted from CTE mismatch between the encapsulant and the components formed thereon (e.g., a redistribution structure) can be reduced. In addition, the dummy die includes a rigid bulk material, thus a mechanical strength of the semiconductor package can be improved.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor package is provided. The semiconductor package comprises: a first semiconductor device, at least one second semiconductor device and at least one dummy die, laterally separated from one another; an encapsulant, laterally encapsulating the first semiconductor device, the at least one second semiconductor device and the at least one dummy die, wherein a Young's modulus of the at least one dummy die is greater than a Young's modulus of the encapsulant, and a sidewall of the at least one dummy die is substantially coplanar with a sidewall of the encapsulant; and a redistribution structure, disposed on a side of the encapsulant, and electrically connected to the first semiconductor device and the at least one second semiconductor device.

In another aspect of the present disclosure, a semiconductor package is provided. The semiconductor package comprises: a semiconductor die, at least one semiconductor die stack and at least one dummy die, laterally separated from one another; an encapsulant, laterally encapsulating the semiconductor die, the at least one semiconductor die stack and the at least one dummy die, wherein a Young's modulus of the at least one dummy die is greater than a Young's modulus of the encapsulant, and a sidewall of the at least one dummy die is substantially coplanar with a sidewall of the encapsulant; a redistribution structure, disposed at a bottom side of the encapsulant, and electrically connected to the semiconductor die and the at least one semiconductor die stack; a package substrate, wherein the redistribution structure is attached on the package substrate, and electrically connected to a routing structure of the package substrate; and a heat dissipation structure, disposed on the package substrate, wherein at least a portion of the heat dissipation structure laterally surrounds the redistribution structure and the encapsulant.

In yet another aspect of the present disclosure, a manufacturing method of a semiconductor package is provided. The manufacturing method of the semiconductor package comprises: encapsulating a first semiconductor device, at least one second semiconductor device and a plurality of dummy dies by an encapsulant, so as to form a reconstructed wafer structure having the first semiconductor device, the at least one second semiconductor device and the plurality of dummy dies, wherein a Young's modulus of the plurality of dummy dies is greater than a Young's modulus of the encapsulant; forming a redistribution structure over the reconstructed wafer structure, wherein the redistribution structure is electrically connected to the first semiconductor device and the at least one second semiconductor device; singulating the reconstructed wafer structure and the redistribution structure through at least one of the plurality of dummy dies, to form a singulated package structure; attaching the singulated package structure onto a package substrate; and disposing a heat dissipation structure over the package substrate, wherein the singulated package structure is laterally surrounded by at least a portion of the heat dissipation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first semiconductor device, at least one second semiconductor device and at least one dummy die, wherein the first semiconductor die, the at least one second semiconductor die and the at least one dummy die are laterally separated from one another, and a sidewall of the first semiconductor device faces toward the at least one second semiconductor device and the at least one dummy die;
   an encapsulant, laterally encapsulating the first semiconductor device, the at least one second semiconductor device and the at least one dummy die, wherein a Young's modulus of the at least one dummy die is greater than a Young's modulus of the encapsulant, and a sidewall of the at least one dummy die is substantially coplanar with a sidewall of the encapsulant; and
   a redistribution structure, disposed on a side of the encapsulant, and electrically connected to the first semiconductor device and the at least one second semiconductor device.

2. The semiconductor package according to claim 1, wherein the at least one dummy die is electrically isolated from the first semiconductor device, the at least one second semiconductor device and the redistribution structure.

3. The semiconductor package according to claim 1, wherein a portion of the encapsulant is sandwiched between the redistribution structure and a surface of the at least one dummy die facing the redistribution structure.

4. The semiconductor package according to claim 1, wherein the at least one dummy die comprises a rigid bulk material and a polymer layer disposed over the rigid bulk material.

5. The semiconductor package according to claim 4, wherein the polymer layer is in contact with the redistribution structure.

6. The semiconductor package according to claim 1, wherein the at least one dummy die is free of an electronic device.

7. The semiconductor package according to claim 1, wherein the at least one second semiconductor device and the at least one dummy die are arranged along a side of the first semiconductor device extending along a first direction.

8. The semiconductor package according to claim 7, wherein a first spacing between the at least one dummy die and the first semiconductor device is less than a second spacing between the at least one second semiconductor device and the first semiconductor device.

9. The semiconductor package according to claim 8, wherein a length of the at least one dummy die along a second direction intersected with the first direction is greater than a length of the at least one second semiconductor device along the second direction.

10. The semiconductor package according to claim 7, wherein the at least one dummy die includes a plurality of dummy dies, the at least one second semiconductor device includes a plurality of second semiconductor devices, and the plurality of second semiconductor devices are located between the plurality of dummy dies.

11. The semiconductor package according to claim 1, wherein the at least one dummy die includes a plurality of first dummy dies and a plurality of second dummy dies, the plurality of first dummy dies is surrounded by the plurality of second dummy dies, and sidewalls of the plurality of second dummy dies are substantially coplanar with the sidewall of the encapsulant.

12. The semiconductor package according to claim 11, wherein sidewalls of the plurality of first dummy dies are covered by the encapsulant.

13. The semiconductor package according to claim 11, wherein at least one second dummy die of the plurality of second dummy dies is arranged along a side of the encapsulant, and has a footprint area smaller than a footprint area of at least one first dummy die of the plurality of first dummy dies.

14. The semiconductor package according to claim 1, wherein the first semiconductor device includes a logic die, and the second semiconductor device includes a stack of memory dies.

15. A semiconductor package, comprising:
- a semiconductor die, at least one semiconductor die stack and at least one dummy die, wherein the semiconductor die, the at least one semiconductor die stack and the at least one dummy die are laterally separated from one another, and a sidewall of the semiconductor die faces toward the at least one semiconductor die stack and the at least one dummy die;
- an encapsulant, laterally encapsulating the semiconductor die, the at least one semiconductor die stack and the at least one dummy die, wherein a Young's modulus of the at least one dummy die is greater than a Young's modulus of the encapsulant, and a sidewall of the at least one dummy die is substantially coplanar with a sidewall of the encapsulant;
- a redistribution structure, disposed at a bottom side of the encapsulant, and electrically connected to the semiconductor die and the at least one semiconductor die stack;
- a package substrate, wherein the redistribution structure is attached on the package substrate, and electrically connected to a routing structure of the package substrate; and
- a heat dissipation structure, disposed on the package substrate, wherein at least a portion of the heat dissipation structure laterally surrounds the redistribution structure and the encapsulant.

16. The semiconductor package according to claim 15, wherein the package substrate includes an insulating core substrate and the routing structure formed over the insulating core substrate.

17. The semiconductor package according to claim 15, wherein the heat dissipation structure is a heat dissipation ring, standing on the package substrate and laterally surrounding the redistribution structure and the encapsulant.

18. The semiconductor package according to claim 15, wherein the heat dissipation structure is a heat dissipation lid having a wall portion and a capping portion over the wall portion, the wall portion stands on the package substrate and laterally surrounds the redistribution structure and the encapsulant, and the capping portion covers the wall portion, the encapsulant and the redistribution structure.

19. A manufacturing method of a semiconductor package, comprising:
- encapsulating a first semiconductor device, at least one second semiconductor device and a plurality of dummy dies by an encapsulant, so as to form a reconstructed wafer structure having the first semiconductor device, the at least one second semiconductor device and the plurality of dummy dies, wherein a Young's modulus of the plurality of dummy dies is greater than a Young's modulus of the encapsulant, wherein the first semiconductor device, the at least one second semiconductor device and the plurality of dummy dies are laterally separated from one another, and a sidewall of the first semiconductor device faces toward the at least one second semiconductor device and the plurality of dummy dies;
- forming a redistribution structure over the reconstructed wafer structure, wherein the redistribution structure is electrically connected to the first semiconductor device and the at least one second semiconductor device;
- singulating the reconstructed wafer structure and the redistribution structure through at least one of the plurality of dummy dies, to form a singulated package structure;
- attaching the singulated package structure onto a package substrate; and
- disposing a heat dissipation structure over the package substrate, wherein the singulated package structure is laterally surrounded by at least a portion of the heat dissipation structure.

20. The manufacturing method of the semiconductor package according to claim 19, wherein the first semiconductor device, the at least one second semiconductor device and the at least one dummy die are attached onto a carrier before being encapsulated by the encapsulant, and the carrier is removed after forming the redistribution structure.

* * * * *